(12) United States Patent
Koyama et al.

(10) Patent No.: US 8,304,984 B2
(45) Date of Patent: Nov. 6, 2012

(54) ORGANIC ELECTROLUMINESCENT ELEMENT

(75) Inventors: Hirokazu Koyama, Hino (JP); Yoshiyuki Suzuri, Hino (JP)

(73) Assignee: Konica Minolta Holdings, Inc. (JP)

( * ) Notice: Subject to any disclaimer, the term of this patent is extended or adjusted under 35 U.S.C. 154(b) by 0 days.

(21) Appl. No.: 12/934,815

(22) PCT Filed: Sep. 15, 2009

(86) PCT No.: PCT/JP2009/066082
§ 371 (c)(1),
(2), (4) Date: Sep. 27, 2010

(87) PCT Pub. No.: WO2010/032721
PCT Pub. Date: Mar. 25, 2010

(65) Prior Publication Data
US 2011/0156577 A1  Jun. 30, 2011

(30) Foreign Application Priority Data
Sep. 19, 2008 (JP) .................. 2008-240599

(51) Int. Cl.
*H01J 1/62* (2006.01)
*H01J 63/04* (2006.01)

(52) U.S. Cl. ........ 313/504; 313/483; 313/500; 313/501; 313/502; 313/503; 313/505; 313/506

(58) Field of Classification Search .................. None
See application file for complete search history.

(56) References Cited

U.S. PATENT DOCUMENTS

| 5,955,837 | A | 9/1999 | Horikx et al. |
| 7,455,793 | B2 * | 11/2008 | Hsu et al. .............. 252/500 |
| 2003/0071567 | A1 | 4/2003 | Eida et al. |
| 2005/0224765 | A1 | 10/2005 | Hsu et al. |
| 2005/0275346 | A1 | 12/2005 | Eida et al. |
| 2007/0116916 | A1 | 5/2007 | Ito et al. |

FOREIGN PATENT DOCUMENTS

| CN | 1210660 A | 3/1999 |
| CN | 1389085 A | 1/2003 |
| CN | 1781034 A | 5/2006 |
| CN | 1972999 A | 5/2007 |
| DE | 69717599 T2 | 9/2003 |
| EP | 0867104 B1 | 12/2002 |
| EP | 1317165 A1 | 6/2003 |
| EP | 1619524 A1 | 1/2006 |

(Continued)

OTHER PUBLICATIONS

English machine translation of JP 2006-171336 (Takayama et al).*

(Continued)

*Primary Examiner* — Natalie Walford
(74) *Attorney, Agent, or Firm* — Cantor Colburn LLP

(57) ABSTRACT

Disclosed is an organic electroluminescent element in which light extraction efficiency is improved without lowering the electrical conductivity or the transporting or blocking performance for electrons or holes in a transparent electrode or an organic layer. The organic electroluminescent element of the invention is characterized in that it comprises a transparent substrate and provided thereon, at least a first electrode section with a light transmission property, an organic light emission layer section and a second electrode section in this order, the first electrode section containing at least metal nanowires, wherein an average refractive index of the first electrode section is lower than that of the organic light emission layer section.

16 Claims, 1 Drawing Sheet

FOREIGN PATENT DOCUMENTS

| | | |
|---|---|---|
| EP | 1756219 B1 | 4/2010 |
| JP | 9-129375 A | 5/1997 |
| JP | 2000-503163 A | 3/2000 |
| JP | 2003-257620 A | 9/2003 |
| JP | 2004-348121 A | 12/2004 |
| JP | 2006-171336 A | 6/2006 |
| JP | 2007-74316 A | 3/2007 |
| JP | 2007-531807 A | 11/2007 |
| JP | 2008-78039 A | 4/2008 |
| KR | 10-2006-0013526 A | 2/2006 |
| KR | 10-2007-0008664 A | 1/2007 |
| KR | 10-2007-0049248 A | 5/2007 |
| TW | 244876 B | 12/2005 |
| WO | 98/17083 A1 | 4/1998 |
| WO | 02/17689 A1 | 2/2002 |
| WO | 2004/097466 A1 | 11/2004 |
| WO | 2006/078264 A2 | 7/2006 |

OTHER PUBLICATIONS

English machine translation of JP 2006-171336 (Takayama et al) from Jun. 2006.*

International Search Report for International Application No. PCT/JP2009/066082 mailed Oct. 20, 2009 with English translation.

* cited by examiner

ORGANIC ELECTROLUMINESCENT ELEMENT

CROSS REFERENCE TO RELATED APPLICATIONS

This is a U.S. national stage application of International Application No. PCT/JP2009/066082, filed on 15 Sep. 2009. Priority under 35 U.S.C. §119(a) and 35 U.S.C. §365(b) is claimed from Japanese Application No. JP2008-240599, filed 19 Sep. 2008, the disclosure of which is also incorporated herein by reference.

FIELD OF THE INVENTION

This invention relates to an organic electroluminescent element, and particularly to an organic electroluminescent element with improved light extraction efficiency comprising an electrode with a light transmission property containing metal nanowires.

TECHNICAL BACKGROUND

As an emission type electronic displaying device, there is an electroluminescent display (hereinafter referred to as ELD). As elements constituting the ELD, there are mentioned an inorganic electroluminescent element and an organic electroluminescent element (hereinafter referred to as organic EL element). The inorganic EL element has been used for a plane-shaped light source, but a high voltage alternating current has been required to drive the element. An organic EL element has a structure in which a light emission layer containing a light emission compound is provided between a cathode and an anode, and an electron and a hole are injected into the light emission layer and recombined to form an exciton. The element emits light, utilizing light (fluorescent light or phosphorescent light) generated by inactivation of the exciton, and the element can emit light by applying a relatively low voltage of from several volts to several decade volts. The element has a wide viewing angle and a high visualization property, since the element is of self light emission type. Further, the element is a thin, complete solid device, and therefore, the element is marked from the viewpoint of space saving and portability. Further, the organic EL element is expected to be applied to a backlight of a liquid crystal display and an illuminating device as well as a display of self light emission type.

However, in the organic EL element to be put into practical use, development of an organic EL element efficiently emitting light with high luminance at low power consumption is desired.

The light emission efficiency of the organic EL element is divided into an inner efficiency and an external efficiency (or light extraction efficiency). In the organic EL element, the surface of each constituent layer such as a substrate, an electrode, or a light emission layer is optically smooth, and the refractive index of the substrate is around 1.5 and the refractive index of materials for the light emission layer is generally high and around 1.7 to 1.8. Accordingly, the organic EL element has problem in that confinement of light due to reflection at the interface between the layers occurs, and light extraction efficiency is not improved. Particularly, ITO (Indium Tin Oxide, Indium oxide doped with tin) is often employed as a transparent electrode, however, ITO has a high refractive index of around 1.9 and causes the problem as described above.

As a method for solving such a problem, a method is disclosed in Patent Document 1 described later in which two or more kinds of materials are heterogeneously dispersed in an electrode in the vicinity of an interface between the electrode layer and an organic layer or in an organic layer in the vicinity of an interface between an electrode layer and the organic layer. However, an electrode or an organic layer in which two or more kinds of materials are heterogeneously dispersed has problem that results in lowering electrical conductivity or transporting or blocking performance of electrons or holes, and therefore, it is especially difficult to employ such a technique in a transparent electrode. In the Patent Document 1, examples in which such a technique is applied to an organic layer or an electrode are not disclosed.

A technique is disclosed in Patent Document 2 described later in which a light loss preventing layer is provided between two layers having a large refractive index difference. However, provision of additional layers results in cost increase or load to productivity. Further, like the disclosure of the Patent Document 1, the provision of a light loss preventing layer between an electrode and an organic layer has problem that results in lowering electrical conductivity or transporting or blocking performance of electrons or holes. When the light loss preventing layer is provided on the surface of the electrode opposite the organic layer, only restricted effect is obtained, since there are no effects in an interface phenomenon effect between the organic layer and the transparent electrode. Thus, a technique is sought which is applied directly to a transparent electrode and improves light extraction efficiency without lowering electrical conductivity and the like.

Incidentally, a method in which metal nanowires are employed as a material for a transparent electrode, is disclosed in Patent Document 3 described later, however, there is neither disclosure nor suggestion in this document regarding light extraction efficiency in the organic EL element employing metal nanowires.

PRIOR ART DOCUMENT

Patent Document

Patent Document 1: Japanese Patent O.P.I. Publication No. 9-129375
Patent Document 2: Japanese Patent O.P.I. Publication No. 2003-257620
Patent Document 3: U.S. Patent Publication No. 2007-0074316

DISCLOSURE OF THE INVENTION

Problems to be Solved by the Invention

An object of the invention is to provide an organic electroluminescent element in which light extraction efficiency is improved without lowering the electrical conductivity or the transporting or blocking performance for electrons or holes in a transparent electrode or an organic layer.

Means for Solving the Above Problems

The present invention has been attained by any one of the following constitutions.

1. An organic electroluminescent element comprising a transparent substrate and provided thereon, at least a first electrode section with a light transmission property, an organic light emission layer section and a second electrode section in that order, the first electrode section containing at least metal nanowires, wherein an average refractive index of the first electrode section is lower than that of the organic light emission layer section.

2. The organic electroluminescent element of item 1 above, wherein when the first electrode section is divided in a first electrode part and a second electrode part having the same thickness, the first electrode part being close to the organic light emission layer section and the second electrode part being close to the transparent substrate, the following formula is satisfied:

$$N1s < N1el$$

wherein N1el represents an average refractive index of the first electrode part; and N1s represents an average refractive index of the second electrode part.

3. The organic electroluminescent element of item 1 or 2 above, wherein the first electrode section further contains, in addition to the metal nanowires, at least a first transparent resin component and a second transparent resin component having a refractive index higher than that of the first transparent resin component, in which the second transparent resin component and the metal nanowires are contained in a large amount in a first portion of the first electrode section close to the organic light emission layer section and the first transparent resin component is contained in a large amount in a second portion of the first electrode section close to the transparent substrate.

4. The organic electroluminescent element of item 3 above, wherein the second transparent resin component is a transparent conductive polymer.

5. The organic electroluminescent element of item 1 or 2 above, wherein the first electrode section further contains, in addition to the metal nanowires, at least a first transparent resin component and a transparent inorganic component having a refractive index higher than that of the first transparent resin component, in which the transparent inorganic component and the metal nanowires are contained in a large amount in a first portion of the first electrode section close to the organic light emission layer section and the first transparent resin component is contained in a large amount in a second portion of the first electrode section close to the transparent substrate.

6. The organic electroluminescent element of item 5 above, wherein the transparent inorganic component is a transparent conductive metal oxide.

7. The organic electroluminescent element of any one of items 3 through 6 above, wherein microparticles are incorporated in a portion where the first transparent resin component is contained.

8. The organic electroluminescent element of any one of items 1 through 7 above, wherein the second electrode section is an electrode composed of a metal.

Effects of the Invention

The present invention can provide an organic electroluminescent element in which light extraction efficiency is improved without lowering the electrical conductivity or the transporting or blocking performance for electrons or holes in a transparent electrode or an organic layer.

PREFERRED EMBODIMENT OF THE INVENTION

Figure 1A:
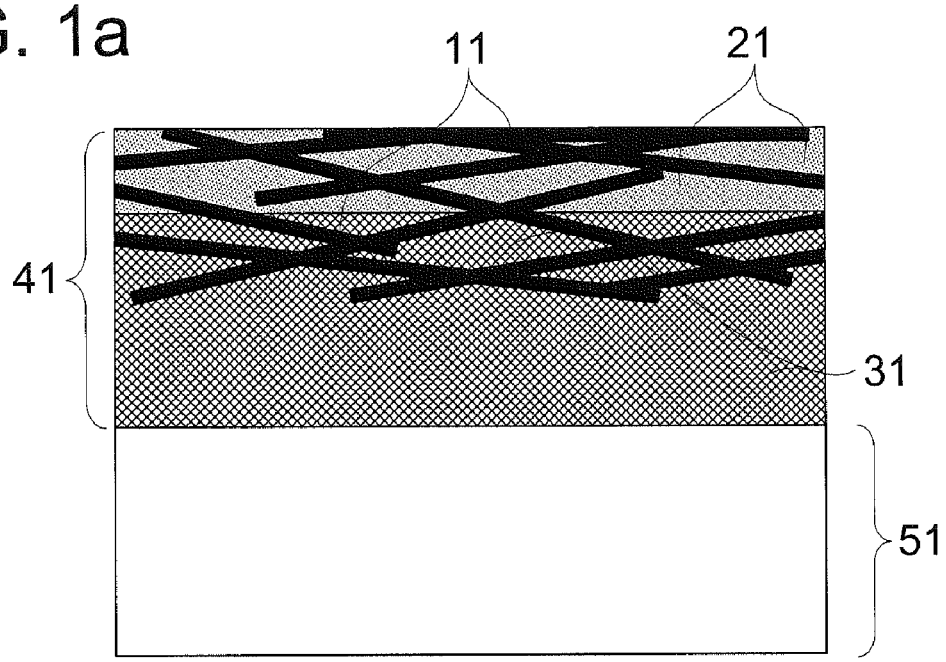
FIGS. 1a and 1b show a schematic view of the structure of the first electrode section with a light transmission property in the invention.

The inventors have found that the metal nanowires have high electrical conductivity as well as light scattering effect, and enable to employ another material with relatively low refractive index without lowering electrical conductivity, whereby the refractive index of the electrode section is capable of being controlled to be lower than that of the light emission layer section, and light confined in the electrode section can be effectively extracted, and have completed the invention.

Next, the present invention, its constitution, and a preferred embodiment for carrying out the present invention will be explained in detail.

The organic electroluminescent element of the invention comprises a transparent substrate and provided thereon, at least a first electrode section with a light transmission property, an organic light emission layer section and a second electrode section in that order.

In the invention, the organic light emission layer section comprises, in addition to a light emission layer, an organic layer such as a hole injecting layer, a hole transporting layer, an electron transporting layer, an electron injecting layer, a hole blocking layer or an electron blocking layer, the organic layer controlling light emission together with the light emission layer.

In the invention, the first electrode section with a light transmission property is a layer comprising a light transmitting conductive material provided on the transparent substrate. The conductive material and a resin, which bears the conductive material, constitute the first electrode section. A functional layer such as an easy adhesion layer, an anti-static layer or a barrier layer provided in advance on the transparent substrate constitutes a part of the transparent substrate but does not constitute the first electrode section.

In the invention, the second electrode section is a layer comprising a conductive material provided on the organic light emission layer section, and may be a layer composed only of the conductive material. However, when the conductive material and a resin, which bears the conductive material, are used in combination, the conductive material and a resin constitute the second electrode section.

In the invention, the average refractive index of the organic light emission layer section or the first electrode section refers to a refractive index of the whole organic light emission layer section or the whole first electrode section which are observed macroscopically. For example, the refractive index can be determined by carrying out optical measurement of each of the whole of the organic light emission layer section and the whole of the first electrode section as one layer. Specifically, the refractive index can be determined as a ratio of the optical distance and the physical distance of each of the whole of the organic light emission layer section and the whole of the first electrode section as one layer. When the multi layers are formed, and the optical thickness of each layer can be measured, the refractive index may be determined as a ratio of the sum of the optical thickness of each layer and the sum of the physical thickness of each layer.

The refractive index can be determined employing a commercially available ellipsometer or employing both spectral reflectance measurements measured through a spectrophotometer and the analysis software attached to the apparatus.

When the first electrode section is divided in a first electrode part and a second electrode part having the same thickness, the first electrode part being close to the organic light emission layer section and the second electrode part being close to the transparent substrate, a refractive index of the first electrode part N1el and a refractive index of the second electrode part N1s can be determined, for example, according to the following method. In the cross section surface exposed by oblique cutting of the first electrode section, the average refractive index in the depth direction may be determined at a position which is the center of the thickness.

[Transparent Substrate]

The transparent substrate employed for the transparent electrode in the present invention is not particularly limited as long as it exhibits high light transmission property. For example, a glass substrate, a resin substrate, and a resin film are suitably used in view of their high hardness and the ease which a conductive layer can be formed on their surfaces. A transparent resin film is preferably employed in view of low weight and high flexibility.

In the invention, the transparent film preferably employed for the transparent substrate is not particularly limited, and material, shape, structure, thickness or hardness thereof may be appropriately selected from those known in the art. Examples of the substrates include a polyester resin film such as a polyethylene terephthalate (PET) film, a polyethylene naphthalate film or a modified polyester film; a polyolefin resin film such as a polyethylene (PE) film, a polypropylene (PP) film, a polystyrene film, or a cycloolefin resin film; a vinyl resin film such as a polyvinyl chloride film, or a polyvinylidene chloride film; a polyvinyl acetal resin film such as polyvinyl butyral resin film; a polyether ether ketone (PEEK) resin film; a polysulfone (PSF) resin film; a polyethersulfone (PES) resin film; a polycarbonate (PC) resin film; a polyamide resin film; a polyimide resin film; an acryl resin film; and a triacetyl cellulose (TAC) resin film. A resin film having a transmittance of 80% or more in the visible wavelength region (380-780 nm) is preferably applicable as the transparent resin film in the present invention. Among these, a biaxially-oriented polyethylene terephthalate film, a biaxially-oriented polyethylene naphthalate film, a polyethersulfone film or a polycarbonate film is preferred from a viewpoint of transparency, heat resistance, easy handling, strength and cost, and a biaxially-oriented polyethylene terephthalate film or a biaxially-oriented polyethylene naphthalate film is more preferred.

In order to secure the wettability and adhesion property of a coating solution, the transparent substrate employed in the present invention can be subjected to surface treatment or provided with an easy adhesion layer. A well-known technique can be used with respect to the surface treatment or the easy adhesion layer. Examples of the surface treatment include surface activating treatment such as corona discharge treatment, flame treatment, ultraviolet treatment, high-frequency wave treatment, glow discharge process, activated plasma treatment or laser treatment.

Examples of materials for the easy adhesion layer include polyester, polyamide, polyurethane, a vinyl copolymer, a butadiene copolymer, an acryl copolymer, a vinylidene copolymer and an epoxy copolymer. The easy adhesion layer may be a single layer or may be two or more layers thereof in order to increase adhesion property. A barrier coat layer may be beforehand formed on the transparent substrate, or a hard coat layer may be beforehand formed on the surface of the transparent substrate opposite the first electrode with a light transmission property.

The provision of a layer with a refractive index lower than that of the transparent substrate or a microparticle-containing layer on the surface of the transparent substrate opposite the first electrode is a preferred embodiment of the invention, since light confined near the transparent substrate surface can be effectively extracted.

[First Electrode Section with Light Transmission Capability]

The first electrode section with a light transmission property in the invention constitutes an anode of an EL element.

The schematic illustration of the structure of the first electrode section with a light transmission property in the invention is as shown in FIG. 1. The first electrode section 41 with a light transmission property in the invention contains at least metal nanowires 11 provided on the transparent substrate 51. It is preferred that a portion of the first electrode section close to the transparent substrate comprises a first transparent resin 31 which bears the whole section, and a portion of the first electrode section far from the transparent substrate comprises a second transparent resin component-containing portion or a transparent inorganic component-containing portion 21.

In the embodiment of FIG. 1(a), the transparent inorganic component-containing portion 21 exists in the gap on the surface side of the electrode in the three dimensional mesh structure (conductive network) formed from metal nanowires 11. The metal nanowires 11 constitutes the surface of the electrode together with the transparent inorganic component-containing portion 21, and at the same time, can function as an auxiliary electrode of the transparent inorganic component-containing portion 21. The first transparent resin 31 exists between the gap on the side of the transparent substrate 51 in the three dimensional mesh structure formed from metal nanowires 11 and the transparent substrate 51, and fixes a portion containing the metal nanowires 11 onto the transparent substrate 51.

Figure 1B:
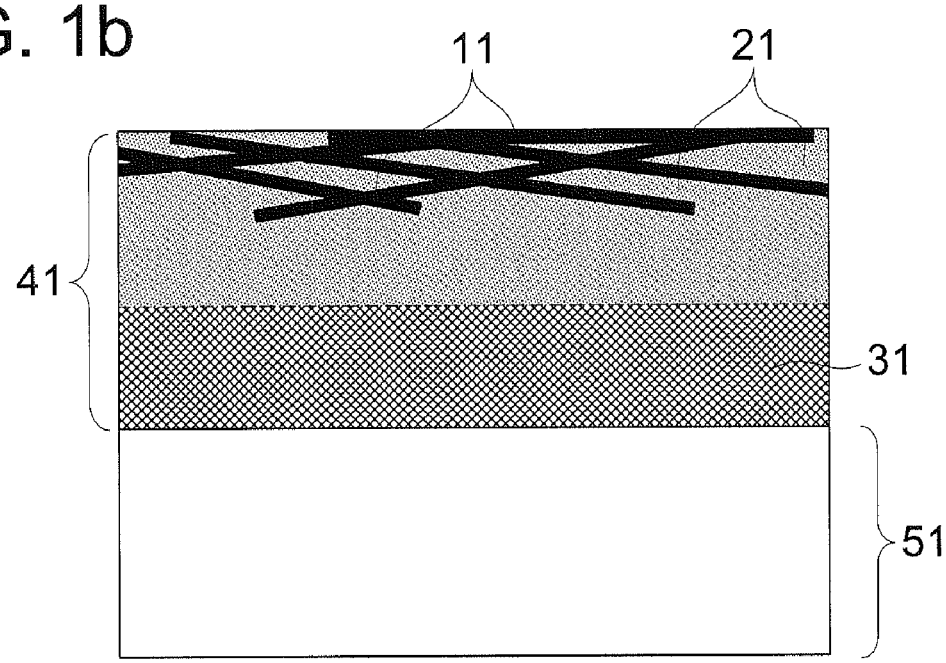

In the embodiment of FIG. 1(b), the transparent inorganic component-containing portion 21 exists so as to enclose the three dimensional mesh structure formed from metal nanowires 11. The metal nanowires 11 constitute the surface of the electrode together with the transparent inorganic component-containing portion 21, and at the same time, can function as an auxiliary electrode of the transparent inorganic component-containing portion 21. The first transparent resin 31 exists between the transparent inorganic component-containing portion 21 and the transparent substrate 51, and fixes a portion containing the metal nanowires 11 onto the transparent substrate 51.

The total optical transmittance of the first electrode section with a light transmission property in the present invention is preferably at least 60%, more preferably at least 70%, and still more preferably at least 80%.

The total optical transmittance can be determined according to a method known in the art, employing a spectrophotometer. Further, the electrical resistance value of the first electrode section with a light transmission property in the invention is preferably at most 100Ω/□, more preferably at most 50Ω/□, and still more preferably at most 10Ω/□ in terms of surface resistivity. An electrical resistance value exceeding 100Ω/□ may lower plane uniformity of light emitted from an organic EL element. The above surface resistivity can be determined, for example, based on JIS K7194: 1994 (Test method for resistivity of conductive plastics with a 4-pin probe measurement method) or can be conveniently determined employing a commercially available surface resistivity meter.

The thickness of the transparent electrode in the invention is not specifically limited, and can be appropriately selected depending on intended purposes. Generally, the thickness of the transparent electrode is preferably at most 10 μm. The smaller thickness of the transparent electrode is more preferred, since transparency and flexibility increase.

[Metal Nanowires]

Generally, metal nanowires indicate a linear structure composed of a metallic element as a main constituent. In particular, the metal nanowires in the present invention indicate a linear structure having a diameter of from an atomic scale to a nanometer (nm) size.

In order to form a long conductive path by one metal nanowire and to realize an appropriate light scattering property, an average length of the metal nanowires in the invention preferably 3 μm or more, more preferably from 3 to 500 μm, and still more preferably from 3 to 300 μm. In addition, the relative standard deviation of the length of the metal nanowires is preferably 40% or less. Further, a smaller average diameter is preferred from a viewpoint of transparency, and a larger average diameter is preferred from a conductive viewpoint. In the present invention, the average diameter of the metal nanowires is preferably from 10 to 300 nm, and more preferably 30 to 200 nm. Furthermore, the relative standard deviation of the diameter is preferably 20% or less.

A metal composition of the metal nanowires in the invention is not specifically limited, and can be composed of one or two or more kinds of noble metal elements or base metal elements. It is preferred that the composition contains at least one kind of a metal selected from the group consisting of noble metals (for example, gold, platinum, silver, palladium, rhodium, iridium, ruthenium and osmium), iron, cobalt, copper and tin. It is more preferred that the composition contains at least silver from a conductive viewpoint.

Moreover, for the purpose of achieving compatibility of conductivity and stability (sulfuration resistance, oxidation resistance and migration resistance of the metal nanowires), it is preferred that the composition contains silver and at least one kind of a metal belonging to the noble metals except silver. When the metal nanowires of the present invention contain two or more kinds of metallic elements, the metal composition of the metal nanowires may be different between the surface and the inside thereof, and the entire metal nanowires may have the same metal composition.

In the present invention, a manufacturing means of the metal nanowires is not specifically limited, and as the manufacturing means, known means such as a liquid phase method or a gas phase method can be employed. There is no restriction to a typical manufacturing method, and known methods can be employed. For example, a manufacturing method of Ag nanowires may be referred to Adv. Mater., 2002, 14, 833-837 and Chem. Mater., 2002, 14, 4736-4745; a manufacturing method of Au nanowires may be referred to Japanese Patent O.P.I. Publication No. 2006-233252; a manufacturing method of Cu nanowires may be referred to Japanese Patent O.P.I. Publication No. 2002-266007; and a manufacturing method of Co nanowires may be referred to Japanese Patent O.P.I. Publication No. 2004-149871. Specifically, the manufacturing methods of Ag nanowires, described in the aforementioned Adv. Mater. and Chem. Mater., may be preferably employed as a manufacturing method of the metal nanowires in the present invention, since a large amount of Ag nanowires can be easily manufactured in an aqueous system and the electrical conductivity of silver is highest of all metals.

In the invention, the metal nanowires are brought into contact with each other to form a three dimensional conductive network which realizes high electrical conductivity, and the window portion in the conductive network where the metal nanowires do not exist enables transmission of light. It is possible to extract efficiently light from the organic light emission layer section due to the properties described above and the scattering effect of the metal nanowires. An embodiment in which the metal nanowires are contained in a portion of the first electrode close to the organic light emission layer section can utilize more efficiently the scattering effect, which is a preferred embodiment.

Carbon nanotube (CNT) is also known as a conductive material in the form of a fabric. The carbon nanotube is poor in light scattering effect on account of small particle size, and is generally a light absorbing material. Accordingly, it does not provide the effects of the invention.

[Constituents Other than Nanowires in the First Electrode]

In the invention, the metal nanowires in the first electrode section have high electrical conductivity as well as light scattering effect, and enable to employ a resin with relatively low refractive index and the like without lowering electrical conductivity, whereby the refractive index of the first electrode is controlled to be lower than that of the light emission layer section. A combination of these effects makes it possible to extract effectively light confined in the electrode section. In order to develop these effects effectively, it is necessary that the average refractive index of the first electrode section be lower than that of the organic light emission layer section.

The first electrode section in the invention comprises the metal nanowires, and it is preferred that a transparent resin, a transparent inorganic material or the like are employed in combination in order to bear the metal nanowires, and it is sufficient if materials to be employed are appropriately selected so as to satisfy the refractive index relationship described above. Such materials are not specifically limited, and examples of such materials include a polyester resin, a polystyrene resin, an acryl resin, a polyurethane resin, an acryl-urethane resin, a polycarbonate resin, a cellulose resin and a butyral resin. These resins may be used singly or as an admixture of two or more kinds thereof. Further, a UV curable resin may be used.

Further, as the preferred embodiment, when the first electrode section is divided in a first electrode part and a second electrode part having the same thickness, the first electrode part being close to the organic light emission layer section and the second electrode part being close to the transparent substrate, the following formula is satisfied:

$$N1s < N1el$$

wherein N1el represents a refractive index of the first electrode part; and N1s represents a refractive index of the second electrode part. The first electrode section satisfying the above formula can more effectively reduce loss due to interface reflection, and can present the scattering effect of the metal nanowires most effectively.

The first electrode section can satisfy the formula $N1s < N1el$, which further contains, in addition to the metal nanowires, at least a first transparent resin component (for example, the resin described above) and a second transparent resin component having a refractive index higher than that of the first transparent resin component, the second transparent resin component and the metal nanowires being contained in a large amount in a portion of the first electrode section close to the light emission layer section and the first transparent resin component in a large amount in a portion of the first electrode section close to the transparent substrate, or which further contains, in addition to the metal nanowires, at least a first transparent resin component and a transparent inorganic component having a refractive index higher than that of the first transparent resin component, the transparent inorganic component and the metal nanowires being contained in a large amount in a portion of the first electrode section close to the light emission layer section and the first transparent resin component in a large amount in a portion of the first electrode section close to the transparent substrate. Such a first electrode section is a preferred embodiment of the invention.

Further, it is more preferred that the second transparent resin component as described above is a conductive polymer or the transparent inorganic component as described above is a transparent conductive metal oxide. Use of the conductive polymer or the transparent conductive metal oxide enables current application to a small region of a window portion where the metal nanowires do not exist, whereby the first electrode section can function as a complete plane electrode. In order to work the first electrode section as a complete plane electrode, the plane resistance of the conductive materials alone is required to be lower than $10^{10} \Omega/\square$ and is preferably $10^8 \Omega/\square$ or less.

Examples of the conductive polymer include compounds selected from the group consisting of derivatives of polypyrrole, polyaniline, polythiophene, polythienylene vinylene, polyazulene, polyisothianaphthene, polycarbazole, polyacetylene, polyphenylene, polyphenylene vinylene, polyacene, polyphenyl acetylene and polynaphthalene.

Examples of the transparent conductive metal oxide include particles of metal oxides such as $ZrO_2$, $CeO_2$, $ZnO$, $TiO_2$, $SnO_2$, $Al_2O_3$, $In_2O_3$, $SiO_2$, $MgO$, $BaO$, $MoO_2$ and $V_2O_5$; their composite oxide particles; composite metal oxide particles doped with different kinds of atoms; and their metal oxide sol. Among these, particles or sol of indium oxide doped with tin or zinc (ITO, IZO), zinc oxide doped with aluminum or gallium (AZO, GZO), and tin oxide doped with fluorine or antimony (FTO, ATO) can be preferably employed. These may be used alone, or may be used in combination with other resins.

Incorporation of microparticles in the first transparent resin can improve extraction of light at the interface between the first electrode section and the transparent substrate, which is preferred in the invention. The particle diameter of the microparticles is preferably from 0.05 to 5 µm, and more preferably from 0.05 to 2 µm. When the particle diameter of the microparticles is less than 0.05 there is problem in that light scattering and refracting effect is poor, while when the particle diameter of the microparticles exceeds 5 µm, there is problem in smoothness. The refractive index of the microparticles is preferably from 1.2 to 2.0, and more preferably from 1.3 to 1.7. This range of the refractive index can improve light extraction efficiency while reducing light backscattering and suppressing lowering of transmittance. Examples of the microparticles include cross-linked acryl resin microparticles, cross-linked styrene resin microparticles, silica microparticles, melamine/formaldehyde resin microparticles, and their composite microparticles. These microparticles may be employed singly or as an admixture of two or more kinds thereof.

[Formation Method of First Electrode Section]

A formation method of the first electrode section is not specifically limited. When a coating method is employed to form all the constituents, a so-called roll to roll process can be employed, and the coating method is preferred in that continuous production at high speed can be carried out employing an equipment simpler than that in a vacuum process.

A method is preferred in which after forming a layer containing metal nanowires and a conductive polymer or transparent conductive metal oxides on the releasing surface of a smooth releasing substrate, the resulting layer is transferred onto a transparent substrate so as to form a transparent electrode. In the organic EL element, the first electrode is required to have a surface with high smoothness, and this method can provide the electrode surface with high smoothness in a simple and stable manner. According to this method, a layer, containing the metal nanowires, and the conductive polymer with a relatively high refractive index or the transparent conductive metal oxide with a relatively high refractive index, is provided in a portion of the first electrode section close to the light emission layer section.

As a releasing substrate employed in the manufacturing method of a transparent electrode according to the transfer process above, there are mentioned a resin substrate and a resin film. The above resins are not specifically limited, and can be selected from those known in the art. For example, appropriately employed are substrates and films, which are composed of a single layer or a plurality of layers composed of a synthetic resin such as a polyethylene terephthalate resin, a vinyl chloride resin, an acrylic resin, a polycarbonate resin, a polyimide resin, a polyethylene resin or a polypropylene resin. Further employed may be a glass substrate and a metal substrate. Further, if desired, the surface (the releasing surface) of the releasing substrate may be subjected to surface treatment via application of a releasing agent such as a silicone resin, a fluorine-containing resin or a wax.

The surface of the releasing substrate preferably has high smoothness, it affects the smoothness of the surface after transfer of a transparent conductive layer. Specifically, the releasing substrate has Ry of preferably not more than 50 nm, more preferably not more than 40 nm, and still more preferably not more than 30 nm. Moreover, the releasing substrate has Ra of preferably not more than 5 nm, more preferably not more 3 nm, and still more not more than 1 nm.

In the present invention, Ry and Ra, which show the surface smoothness of the surface of a transparent conductive layer, the following meanings: Ry=a maximum height (the vertical interval between the summit part and a bottom part in the surface); and Ra=an arithmetic mean roughness, which are values based on the surface roughness specified in JIS B601 (1994). The transparent electrode in the present invention is characterized in that the surface smoothness of the transparent conductive layer the surface satisfies the formula $Ry \leqq 50$ nm, and at the same time it is preferred that the surface smoothness satisfies the $Ra \leqq 5$ nm. In the present invention, a commercially available atomic force microscope (AFM) can be used for measurement of Ry and Ra. For example, they can be measured by the following method.

As an AFM, SPI3800N probe station and an SPA400 multifunctional-capability type module made by Seiko Instruments Co., Ltd., are used. The sample cut off in a square having a side of about 1 cm is set on a level sample stand on a piezo scanner, then, a cantilever is allowed to approach to a surface of the sample. When the cantilever reaches the region where an atomic force can function, the cantilever is scanned in the XY direction, and irregularity of the surface of the sample is caught by displacement of the piezo element in the Z direction. A piezo scanner which can scan the XY direction of 150 µm and the Z direction of 5 µm is used for the measurement. A cantilever used is silicon cantilever SI-DF20 made by Seiko Instruments Co., Ltd., and measurement is done in a DFM mode (Dynamic Force Mode) using the resonant frequency of 120 to 150 kHz, the spring constant of 12 to 20 N/m. The portion of 80×80 µm is measured with the scanning frequency of 0.1 Hz.

There is no restriction in particular to the method of forming a layer containing metal nanowires and a conductive polymer or transparent conductive metal oxides on the releasing surface of the releasing substrate a transparent substrate. However, a liquid phase film forming method such as a coating method or a printing method is preferably employed in view of productivity and production cost, electrode qualities such as smoothness and uniformity, as well as reduction of environmental load. As the coating method employed may be a roller coating method, a bar coating method, a dip coating method, a spin coating method, a casting method, a die coating method, a blade coating method, a bar coating method, a gravure coating method, a curtain coating method, a spray coating method, or a doctor coating method, while as the printing method employed may be a letterpress (typographic) printing method, a porous (screen) printing method, a lithographic (offset) printing method, an intaglio (gravure) printing, a spray printing method, and an ink-jet printing method. As preliminary treatment to enhance close contact and coatability, if desired, the surface of the releasing substrate may be subjected to physical surface treatment such as corona discharge treatment or plasma discharge treatment.

As an adhesive agent used for the transfer to the transparent substrate, the first transparent resin component in the invention may be employed as long as it has an adhesive capability, and for example, the transparent resin as described above may be employed. The adhesive agent may be applied onto the releasing substrate side or onto the transparent substrate side. The adhesive agent is not specifically limited as long as it is transparent in the visible region and has transfer ability. The adhesive agent may be a curable resin or a thermoplastic resin as long as it is transparent. A heat curable resin, an UV curable resin and an electron beam curable resin are cited as examples of a curable resin. Among these curable resins, a UV curable resin is preferably used, since it excels in working property, and a resin curing equipment used is simple. A UV curable resin is a resin which is to be hardened through a cross linkage reaction by UV irradiation, and one comprising a monomer which has an ethylenic unsaturated double bond is preferably used. Examples of the UV curable resin include an acrylic urethane resin, a polyester acrylate resin, an epoxy acrylate resin and a polyol acrylate resin. In the present invention, a UV curable resin of acrylic type or acrylic urethane type is preferably used as a main component of a binder.

The acrylic urethane resin can be easily obtained by reacting a polyester polyol with an isocyanate monomer or its prepolymer and then reacting the resulting product with an acrylate having a hydroxy group such as 2-hydroxyethyl acrylate, 2-hydroxyethyl methacrylate (hereinafter, the acrylate comprises methacrylate) or 2-hydroxypropyl acrylate. For example, the compound described in Japanese Patent O.P.I. Publication No. 59-151110 can be used. More specifically, the mixture of 100 parts of UNIDIC 17-806 (made by DIC Co., Ltd.) and 1 part of COLONATE L (made by Nippon Polyurethane Industry Co., Ltd.) is preferably used.

As an example of UV curable polyester acrylate resin, there can be cited a compound which is easily obtained by reacting a polyester polyol with a monomer such as 2-hydroxyethyl acrylate or 2-hydroxypropyl acrylate. The compound described in Japanese Patent O.P.I. Publication No. 59-151112 can be used.

As an example of an UV curable epoxy acrylate resin, there can be cited a compound which is obtained by reacting an epoxy acrylate oligomer in the presence of a reactive diluting agent and a photoinitiator. The compound described in Japanese Patent O.P.I. Publication No. 1-105738 can be used.

Examples of a UV curable polyol polyacrylate resin include trimethylolpropane triacrylate, ditrimethylolpropane tetraacrylate, pentaerythritol triacrylate, pentaerythritol tetraacrylate, dipentaerythritol hexaacrylate and alkyl modified dipentaerythritol pentaacrylate.

The polymerizable monomers having one unsaturated double bond in the molecule include methyl acrylate, ethyl acrylate, butyl acrylate, vinyl acetate, benzyl acrylate, cyclohexyl acrylate, and styrene. The polymerizable monomers having two unsaturated double bonds in the molecule include ethylene glycol diacrylate, propylene glycol diacrylate, divinylbenzene, 1,4-cyclohexane diacrylate, 1,4-cyclohexyldiethyl diacrylate, trimethylol propane triacrylate, and pentaerythritol tetraacrylate.

Among these, an acrylic actinic-ray curable resin is preferred as a main component for a binder, which is selected from 1,4-cyclohexane diacrylate, pentaerythritol tetra(meth)acrylate, pentaerythritol tri(meth)acrylate, trimethylolpropane (meth)acrylate, trimethylolethane (meth)acrylate, dipentaerythritol tetra(meth)acrylate, dipentaerythritol penta(meth)acrylate, dipentaerythritol hexa(meth)acrylate, 1,2,3-cyclohexane tetramethacrylate, polyurethane polyacrylate and polyester polyacrylate.

As a photoinitiator for these UV curable resins, there are mentioned benzoin or its derivatives; and acetophenone, benzophenone, hydroxybenzophenone, Michler's ketone, α-amyloxim ester, thioxanthone and their derivatives. The photoinitiator may be used with a photosensitizer. The above-mentioned photoinitiator can also be used as a photosensitizer. Moreover, sensitizers such as n-butylamine, triethylamine and tri-n-butylphosphine can be used when the photoinitiator of an epoxy acrylate is employed. The amount of the photoinitiator or the photosensitizer used in a UV curable resin composition is 0.1 to 15 parts by weight, and preferably from 1 to 10 parts by weight, based on 100 parts by weight the composition.

After a releasing substrate on which a transparent conductive layer is pasted on a transparent substrate and subjected UV irradiation to cure the adhesive agent, the releasing substrate is separated from the resulting material to obtain the transparent conductive layer transferred to the transparent substrate side. Herein, the adhesion method is not specifically limited. A sheet press machine or a roll press machine can be used for adhesion, and a roll press machine is preferably used. The roll press machine is suitably used since it can give pressure uniformly and manufacturing efficiency better than the sheet press machine.

[Patterning]

The first electrode section in the present invention can be patterned. There is no restriction in particular to the method and process of patterning, and a well-known approach can be appropriately applied. For example, a patterned layer containing metal nanowires and a conductive polymer or transparent conductive metal oxides being formed on the releasing surface and then transferred onto a transparent substrate, the patterned transparent electrode can be obtained. Specifically, the following methods can be preferably used.

(i) A method in which a layer containing metal nanowires, a conductive polymer or a transparent conductive metal oxide is directly formed in the form of pattern on a releasing substrate by using a printing method.

(ii) A method in which a layer containing metal nanowires, a conductive polymer or a transparent conductive metal oxide is uniformly formed on a releasing substrate, followed by carrying out pattering employing a conventional photolithographic process.

(iii) A method in which a layer containing a UV curable resin and containing metal nanowires, a conductive polymer or a transparent conductive metal oxide is uniformly formed on a releasing substrate, followed by carrying out pattering in the same manner as a photolithographic process.

(iv) A method in which a layer containing metal nanowires, a conductive polymer or a transparent conductive metal oxide is uniformly formed on a photoresist negative pattern which has been provided on a releasing substrate, followed by carrying out pattering using a lift off method.

By using any one of the above-mentioned methods, the patterned layer containing metal nanowires, a conductive polymer or a transparent conductive metal oxide formed on a releasing substrate is transferred to a transparent substrate, whereby a patterned transparent electrode can be formed.

[Organic Light Emission Layer Section]

In the invention, the organic light emission layer section comprises, in addition to a light emission layer, an organic layer such as a hole injecting layer, a hole transporting layer, an electron transporting layer, an electron injecting layer, a hole blocking layer or an electron blocking layer, the organic layer controlling light emission together with the light emission layer.

Preferred embodiments of the layer constitution of the organic EL element will be shown below, but the invention is not limited thereto.

(i): First electrode section/Light emission layer/Electron transporting layer/Second electrode section (ii): First electrode section/Hole transporting layer/Light emission layer/Electron transporting layer/Second electrode section (iii): First electrode section/Hole transporting layer/Light emission layer/Hole blocking layer/Electron transporting layer/Second electrode section (iv): First electrode section/Hole transporting layer/Light emission layer/Hole blocking layer/Electron transporting layer/Cathode buffering layer/Second electrode section (v): First electrode section/Anode buffering layer/Hole transporting layer/Light emission layer/Hole blocking layer/Electron transporting layer/Cathode buffering layer/Second electrode section Herein, the light emission layer may be a monochromatic light emission layer whose emission maximum is in a wavelength region of from 430 to 480 nm, in a wavelength region of from 510 to 550 nm or in a wavelength region of from 600 to 640 nm, or may be a white light emission layer in which at least the three monochromatic light emission layers described above are laminated. An intermediate layer may be provided between two monochromatic light emission layers of the at least the three monochromatic light emission layers. The light emission layer of the organic EL element of the invention is preferably a white light emission layer.

In the invention, examples of the light emission material or the doping material used in the organic light emission layer include anthracene, naphthalene, pyrene, tetracene, coronene, perylene, phthaloperylene, naphthaloperylene, diphenylbutadiene, tetraphenylbutadiene, coumarin, oxadiazole, bisbenzoxazoline, bistyryl, cyclopentadiene, a quinoline metal complex, a tris(8-hydroxyquinolato)aluminum complex, a tris(4-methyl-8-hydroxyquinolato)aluminum complex, a tris(5-phenyl-8-hydroxyquinolato)aluminum complex, an aminoquinoline metal complex, a benzoquinoline metal complex, tri-(p-terphenyl-4-yl)amine, 1-aryl-2,5-di(thienyl)pyrrole derivatives, pyrane, quinacridone, rubrene, distyrylbenezene derivatives, distyrylarylene derivatives, various kinds of fluorescent dyes, rare earth metal complexes, and phosphorescence emission materials, but the invention is not specifically limited thereto. It is preferred that the light emission layer contains a light emission material in an amount of 90 to 99.5 parts by mass and a doping material in an amount of 0.05 to 10 parts by mass, the light emission material and the doping material being selected from the compounds described above. The light emission layer is formed employing the compounds described above according to a known method including a vapor deposition method, a coating method and a transfer method. The thickness of the light emission layer is preferably from 0.5 to 500 nm, and more preferably from 0.5 to 200 nm

[Second Electrode Section]

The second electrode section in the invention constitutes a cathode of an organic EL element. The second electrode section in the invention may be a single layer containing only a conductive material, but may be a layer containing, in addition to the conductive material, a resin bearing the conductive material. For the conductive materials, there are mentioned a metal (also referred to as an electron injecting metal), an alloy, an electroconductive compound each having a low working function (not more than 4 eV) and a mixture thereof, which are used as an electrode material of the second electrode section. Concrete examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture, and a rare-earth metal.

Among them, a mixture of an electron injecting metal and a metal higher in the working function than that of the electron injecting metal, such as the magnesium/silver mixture, magnesium/aluminum mixture, magnesium/indium mixture, aluminum/aluminum oxide ($Al_2O_3$) mixture, lithium/aluminum mixture, or aluminum is suitable from the viewpoint of the electron injecting capability and resistance to oxidation. The cathode can be prepared by forming a thin layer of such an electrode material by a method such as a deposition or spattering method. The sheet resistance as the cathode is preferably not more than several hundreds $\Omega/\square$, and the thickness of the layer is ordinarily from 10 nm to 5 μm, and preferably from 50 nm to 200 nm.

If metal materials are used for conductive materials of the second electrode section, light, which reaches the second electrode section side, is reflected and returns to the first electrode section. A part of light is scattered to the back or reflected by the metal nanowires in the first electrode section, however, a second electrode section, employing a metal as the conductive material, enables reuse of the part of light, whereby light extraction efficiency is improved.

EXAMPLES

Next, the present invention will be explained in the following examples, but is not limited thereto. In the examples, "parts" and "%" show "parts by mass" and "% by mass", respectively, unless otherwise specified.

(Metal Nanowires)

In this example, silver nanowires were employed as the metal nanowires. Silver nanowires with an average diameter of 75 nm and an average length of 35 μm was prepared according to the method described in Adv. Mater., 2002, 14, 833-837, filtered employing a ultrafiltration membrane, and washed with water to obtain the silver nanowires. The resulting silver nanowires were re-dispersed in ethanol. Thus, a silver nanowire dispersion solution was prepared which has a silver nanowire content of 5% by mass.

Preparation of Electrode TC-10 with Light Transmission Property (Inventive Example)

A biaxially stretched PET film was employed as a releasing substrate. The surface of the PET film was subjected to corona discharge treatment. The silver nanowire dispersion solution was coated on the resulting PET film through an applicator and dried to give a silver nanowire coating amount of 80 mg/m$^2$, thereby forming a silver nanowire network on the PET film.

A conductive polymer PEDOT/PSS Baytron PH510 (made by H. C. Starck Co., Ltd.) was coated as the second transparent resin component on the silver nanowire network structure obtained above, dried to give a dry thickness of 100 nm, and then subjected to heat treatment at 80° C. for 30 minutes. Thus, an AgNW transfer film was obtained.

Subsequently, the following UV curable transparent resin solution 1 was coated on a biaxially stretched PET film with a bather layer and an easy adhesion layer (with a total optical transmittance of 90%) to obtain a first transparent resin component having a thickness of 5 μm, and laminated on the AgNW transfer film. The laminated material was subjected to UV irradiation to sufficiently cure the first transparent resin component, and then, the releasing PET film as a releasing substrate was separated from the laminates. Thus, the layers of the AgNW transfer film were transferred onto the PET film. Thus, Transparent Electrode TC-10 with a light transmission property was prepared.

| UV Curable Transparent Resin Solution 1 | |
|---|---|
| SP-1 | 3 parts by mass |
| EP-1 | 20 parts by mass |
| OXT221 (produced by Toa Gosei Co., Ltd.) | 40.4 parts by mass |
| OXT212 (produced by Toa Gosei Co., Ltd.) | 25 parts by mass |
| OXT101 (produced by Toa Gosei Co., Ltd.) | 3 parts by mass |
| Propylene carbonate | 3 parts by mass |
| Triisopropanol amine | 0.1 parts by mass |
| X-22-4272 (produced by Shin-etsu Silicone Co., Ltd.) | 0.5 parts by mass |

SP-1

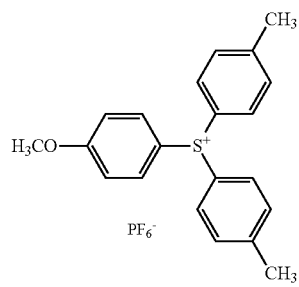

EP-1

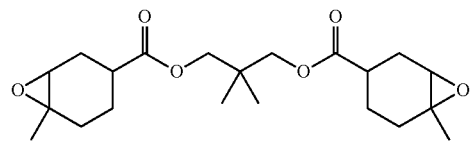

Molecular weight: 380.48

Preparation of Electrode TC-11 with Light Transmission Property (Inventive Example)

Transparent Electrode TC-11 with a light transmission property was prepared in the same manner as in TC-10, except that PEDOT/PSS was not coated.

Preparation of Electrode TC-12 with Light Transmission Property (Inventive Example)

Transparent Electrode TC-12 with a light transmission property was prepared in the same manner as in TC-10, except that a conductive polyaniline dispersion solution ORMECON D1033 (produced by ORMECON Co., Ltd., Germany) containing a sulfonic acid dopant was used instead of PEDOT/PSS.

Preparation of Electrode TC-13 with Light Transmission Property (Inventive Example)

Transparent Electrode TC-12 with a light transmission property was prepared in the same manner as in TC-10, except that the following transparent inorganic component-containing solution B-1 was coated instead of PEDOT/PSS and dried to give a dry thickness of 200 nm.

| Transparent Inorganic Component-Containing Solution B-1 | |
|---|---|
| SnO$_2$ microparticles doped with Sb (produced by Ishihara Sangyo Co., Ltd., SN 100D, Solid content of 30%) | 160 g |
| Compound (UL-1) | 0.2 g |
| Modified Polyester A (Solid content of 18%) | 30 g |
| Water was added to the above composition to make a 1000 ml. | |

UL-1

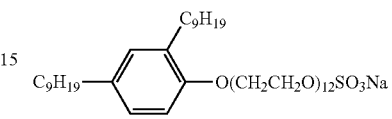

(Synthesis of Modified Aqueous Polyester A)

Into a reaction vessel for polycondensation were placed 35.4 parts by mass of dimethyl terephthalate, 33.63 parts by mass of dimethyl isophthalate, 17.92 parts by mass of dimethyl 5-sodiumsulfoisophthalate, 62 parts by mass of ethylene glycol, 0.065 parts by mass of calcium acetate monohydrate, and 0.022 parts by mass of manganese acetate tetrahydrate, and subjected to ester exchange reaction at 170 to 220° C. under nitrogen atmosphere while removing methanol. Subsequently, 0.04 parts by mass of trimethyl phosphate, 0.04 parts by mass of antimony trioxide as a polycondensation catalyst, and 6.8 parts by mass of 1,4-hexane dicarboxylic acid were added to the resulting reaction mixture, and esterification was carried out at a reaction temperature of from 220 to 235° C., removing substantially a theoretical amount of water. Thereafter, the inside of the reaction vessel was depressurized and heated in one hour, and polycondensation was carried out finally at 280° C. and at a pressure of not more than 133 Pa for about one hour. Thus, a modified aqueous polymer A precursor was obtained. The intrinsic viscosity of this precursor was 0.33.

The above-obtained precursor of 150 g was gradually added, with stirring, in 850 ml of pure water in a 2 liter three neck flask with a stirring impeller, a reflux condenser and a thermometer, further stirred at room temperature for 30 minutes, heated in 1.5 hours so that temperature in the inside of the flask was 98° C., and further heated at this temperature for additional three hours to obtain a solution. After that, the resulting solution was cooled in one hour to room temperature and allowed to stand overnight to obtain a precursor solution having a solid content of 15% by mass.

The above-obtained precursor solution of 1900 ml was placed in a 3 liter four neck flask with a stirring impeller, a reflux condenser, a thermometer and a dropping funnel, heated to 80° C. with stirring. The heated solution was added with a 6.52 ml of a 24% ammonium persulfate aqueous solution, then dropwise added with a monomer mixture solution (a mixture of 28.5 g of glycidyl methacrylate, 21.4 g of ethyl acrylate and 21.4 g of methyl methacrylate) in 30 minutes, and reacted for additional 3 hours. Thereafter, the resulting reaction mixture was cooled to not more than 30° C., and filtered. Thus, a modified aqueous polyester A (polyester component/acryl component=80/20) solution having a solid content of 18% by mass was prepared.

Preparation of Electrode TC-14 with Light Transmission Property (Inventive Example)

Electrode TC-14 with a light transmission property was prepared in the same manner as in TC-10, except that the following transparent inorganic component-containing solution B-2 was coated instead of PEDOT/PSS and dried to give a dry thickness of 200 nm.

| <Transparent Inorganic Component-Containing Solution B-2> | |
|---|---|
| SnO$_2$ sol (produced by Taki Chemical Co., Ltd., Ceramace S-8, Solid content of 8%) | 160 g |
| Compound (UL-1) | 0.2 g |
| Modified Polyester A (Solid content of 18%) | 30 g |

Water was added to the above composition to make a 1000 ml.

Preparation of Electrode TC-15 with Light Transmission Property (Inventive Example)

Electrode TC-15 with a light transmission property was prepared in the same manner as in TC-10, except that the following transparent resin component-containing solution B-3 was coated instead of PEDOT/PSS and dried to give a dry thickness of 2 μm, and Lumiplus produced by Mitsubishi Gas Chemical Co. Ltd. was coated instead of UV curable transparent resin solution 1 to give a dry thickness of 2 μm.

| <Transparent Resin Component-Containing Solution B-3> | |
|---|---|
| Modified Polyester A (Solid content of 18%) | 200 g |
| Compound (UL-1) | 0.2 g |

Water was added to the above composition to make a 1000 ml.

Preparation of Electrode TC-16 with Light Transmission Property (Inventive Example)

Electrode TC-16 with a light transmission property was prepared in the same manner as in TC-10, except that MX 150 (cross-linked PMMA, a refractive index of 1.49) produced by Soken Kagaku Co., Ltd.) was added in an amount of 5 parts by mass to the UV curable transparent resin solution 1.

Preparation of Electrode TC-20 with Light Transmission property (Comparative Example)

Electrode TC-20 with a light transmission property was prepared in the same manner as in TC-10, except that a resin prepared in accordance with a method described in Example 1 of Patent Document 2005/010114 A1 was used instead of the UV curable transparent resin solution 1, and heat treatment was carried out at 120° C. for 5 minutes instead of UV curing treatment.

Preparation of Electrode TC-21 with Light Transmission Property (Comparative Example)

ITO was vapor deposited onto a PET film with a bather layer (with a total optical transmittance of 90%) to give an average thickness of 150 nm, thereby obtaining Electrode TC-21 with a light transmission property.

(Preparation of Organic EL Element)

Each of Electrodes TC-10 through TC-16, TC-20 and TC-21 with a light transmission property were employed as an anode electrode, and Organic EL Elements OEL-10 through OEL-16, OEL-20 and OEL-21 were prepared according to the following procedures:

<Formation of Hole Transporting Layer>

A hole transporting layer forming coating solution, in which a hole transporting material 4,4'-bis[N-(1-naphthyl)-N-phenylamino]biphenyl (NPD) was dissolved in 1,2-dichloroethane to obtain a 1% by mass solution of the hole transporting material, was coated on the anode, and dried at 80° C. for 60 minutes to form a hole transporting layer with a thickness of 40 nm <Formation of Light Emission Layer>

A red dopant material BtP$_2$Ir (acac), a green dopant material Ir(ppy)$_3$ and a blue dopant material FIr(pic)$_3$ were mixed with polyvinyl carbazole (PVK), so as to give a content of 1% by mass, a content of 2% by mass, and a content of 3% by mass, respectively, each content based on the amount of polyvinyl carbazole (PVK). A light emission layer forming coating solution, in which the resulting mixture was dissolved in 1,2-dichloroethane to give a total solid content of 1% by mass, was coated on the resulting hole transporting layer, and dried at 100° C. for 10 minutes to form a light emission layer with a thickness of 60 nm.

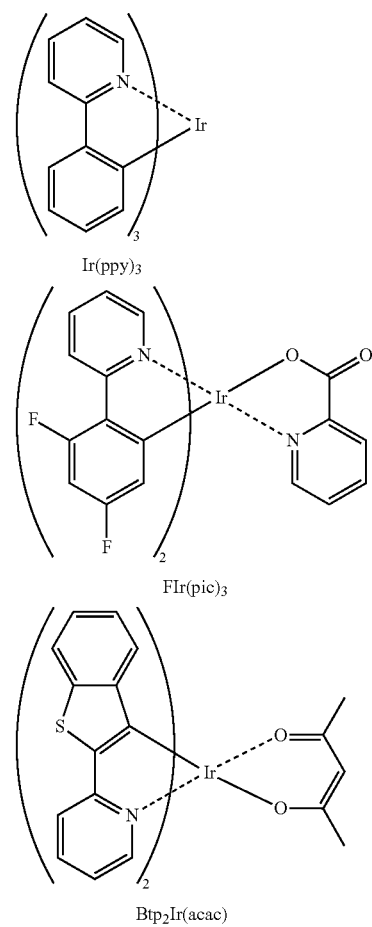

Ir(ppy)$_3$

FIr(pic)$_3$

Btp$_2$Ir(acac)

<Formation of Electron Transporting Layer>

LiF as an electron transporting layer forming material was vapor deposited onto the resulting light emission layer under a vacuum pressure of 5×10$^{-4}$ Pa to form an electron transporting layer having a thickness of 0.5 nm.

<Formation of Cathode Electrode>

Al was vapor deposited onto the resulting electron transporting layer under a vacuum pressure of 5×10$^{-4}$ Pa to form a cathode electrode having a thickness of 100 nm.

<Formation of Sealing Film>

A 300 nm thick Al$_2$O$_3$ was vapor evaporated on a polyethylene terephthalate substrate to prepare a flexible sealing member. An adhesive agent was coated around a cathode electrode except end portions in such a way that externally taken-out terminals of the anode and cathode electrodes were formed. The resulting cathode was laminated onto the foregoing flexible sealing member, and subjected to heat treatment to cure the adhesive agent.

(Measurement of Emission Efficiency)

A direct current voltage was applied to each of Organic EL Elements OEL-10 through OEL-16, OEL-20 and OEL-21, employing Source-Measure Unit 2400 Type produced by KEITHLEY Co., Ltd. to produce light emission at 300 cd, and light emission efficiency (lumen/W) were determined. The light emission efficiency of each of Organic EL Elements was represented as a value relative to the light emission efficiency of OEL-21 being 100. The results are shown in Table 1.

Incidentally, a refractive index was measured according to the following procedures.

(Average Refractive Index of First Electrode Section)

In each of the Electrodes TC-10 through TC-16, TC-20 and TC-21 with a light transmission property, the average refractive index of the first electrode was determined according to the following procedures. The refractive index was that at 550 nm Employing a spectral ellipsometer VASE produced by J.•A.•Woollam Co., Ltd., ellipsometry parameters φ and Δ were determined at an interval of 5° in the incident angle range of 45 to 75° and at an interval of 1.6 nm in the wavelength range of 245 to 1000 nm. The resulting data were analyzed employing an analysis soft produced by J.•A.•Woollam Co., Ltd., thereby obtaining a refractive index.

(Measurement of N1el and N1s)

In the cross section surface exposed by oblique cutting of the first electrode section, the average refractive index in the depth direction was determined at a position which is the center of the thickness, employing the same method as described above.

(Measurement of "Refractive Index of First Transparent Resin Component" and "Refractive Index of Second Transparent Resin or Transparent Inorganic Component")

A single layer of each component was coated on a PET film, and the refractive index thereof was measured in the same manner as described above.

(Measurement of Average Refractive Index of Organic Light Emission Layer)

A single layer of each organic light emission layer was coated on a glass plate, and the refractive index thereof was measured in the same manner as described above.

The average refractive index of the organic light emission layer section was represented by the following formula:

{Sum of(Refractive Index of Each Component Layer× Thickness)÷(Sum of Thickness of Each Component Layer)}

TABLE 1

| | | Metal Nano-wires | Average Refractive Index of Organic Light Emission Layer Section | Average Refractive Index of First Electrode Section | *1 | *2 | N1s | N1el | Addition of Microparticles to First Transparent resin Component | Light Emission Efficiency |
|---|---|---|---|---|---|---|---|---|---|---|
| OEL-10 | Inv. | Present | 1.76 | 1.59 | 1.49 | 1.52 | 1.49 | 1.68 | None | 175 |
| OEL-11 | Inv. | Present | 1.76 | 1.58 | 1.49 | — | 1.49 | 1.67 | None | 160 |
| OEL-12 | Inv. | Present | 1.76 | 1.59 | 1.49 | 1.5 | 1.49 | 1.68 | None | 170 |
| OEL-13 | Inv. | Present | 1.76 | 1.62 | 1.49 | 1.99 | 1.49 | 1.74 | None | 190 |
| OEL-14 | Inv. | Present | 1.76 | 1.61 | 1.49 | 1.89 | 1.49 | 1.72 | None | 180 |
| OEL-15 | Inv. | Present | 1.76 | 1.70 | 1.71 | 1.50 | 1.71 | 1.68 | None | 140 |
| OEL-16 | Inv. | Present | 1.76 | 1.59 | 1.49 | 1.52 | 1.49 | 1.68 | Added | 200 |
| OEL-20 | Comp. | Present | 1.76 | 1.80 | 1.71 | 1.52 | 1.71 | 1.89 | None | 115 |
| OEL-21 | Comp. | None | 1.76 | 1.83 | — | — | — | — | — | 100 |

Inv.: Inventive;
Comp.: Comparative
*1: Refractive Index of First Transparent Resin Component;
*2: Refractive Index of Second Transparent Resin Component or Transparent Inorganic Component As is apparent from the above, the inventive organic EL elements, comprising an electrode with a light transmission property containing the metal nanowires in the invention, provide high light emission efficiency and improved light extraction efficiency without lowering electrical conductivity in the transparent electrode or transporting or blocking performance of electrons or holes in the organic layer.

EXPLANATION OF SYMBOLS

11: Metal Nanowires
21: Transparent Inorganic Component-containing Portion
31: First Transparent Resin
41: First Electrode Section with Light Transmission Property
51: Transparent Substrate

The invention claimed is:

1. An organic electroluminescent element comprising a transparent substrate and provided thereon, at least a first electrode section with a light transmission property, an organic light emission layer section and a second electrode section in that order, the first electrode section containing at least metal nanowires, wherein an average refractive index of the first electrode section is lower than that of the organic light emission layer section;

wherein when the first electrode section is divided in a first electrode part and a second electrode part having the same thickness, the first electrode part being close to the organic light emission layer section and the second electrode part close to the transparent substrate, the following formula is satisfied:

$N1s < N1el$ wherein N1el represents an average refractive index of the first electrode part; and N1s represents an average refractive index of the second electrode part.

2. The organic electroluminescent element of claim 1, wherein the first electrode section further contains at least a first transparent resin component and a second transparent resin component having a refractive index higher than that of the first transparent resin component, in which the second transparent resin component and the metal nanowires are contained in a large amount in a first portion of the first electrode section close to the organic light emission layer section and the first transparent resin component is contained in a large amount in a second portion of the first electrode section close to the transparent substrate.

3. The organic electroluminescent element of claim 2, wherein the second transparent resin component is a transparent conductive polymer.

4. The organic electroluminescent element of claim 1, wherein the first electrode section further contains at least a first transparent resin component and a transparent inorganic component having a refractive index higher than that of the first transparent resin component, in which the transparent inorganic component and the metal nanowires are contained in a large amount in a first portion of the first electrode section close to the organic light emission layer section and the first transparent resin component is contained in a large amount in a second portion of the first electrode section close to the transparent substrate.

5. The organic electroluminescent element of claim 4, wherein the transparent inorganic component is a transparent conductive metal oxide.

6. The organic electroluminescent element of claim 1, wherein the second electrode section is an electrode composed of a metal.

7. The organic electroluminescent element of claim 1, wherein the total optical transmittance of the first electrode section is at least 60%.

8. The organic electroluminescent element of claim 1, wherein a metal composition of the metal nanowires contains silver.

9. The organic electroluminescent element of claim 2, wherein the second transparent resin component is a conductive polymer.

10. The organic electroluminescent element of claim 9, wherein the conductive polymer is selected from the group consisting of derivatives of polypyrrole, polyaniline, polythiophene, polythienylene vinylene, polyazulene, polyisothianaphthene, polycarbazole, polyacetylene, polyphenylene, polyphenylene vinylene, polyacene, polyphenyl acetylene and polynaphthalene.

11. The organic electroluminescent element of claim 4, wherein the transparent inorganic component is a transparent conductive metal oxide.

12. The organic electroluminescent element of claim 11, wherein the transparent conductive metal oxide is selected from particles of $ZrO_2$, $CeO_2$, ZnO, $TiO_2$, $SnO_2$, $Al_2O_3$, $In_2O_3$, $SiO_2$, MgO, BaO, $MoO_2$ and $V_2O_5$; their composite oxide particles; composite metal oxide particles doped with different kinds of atoms; and their metal oxide sol.

13. An organic electroluminescent element comprising a transparent substrate and provided thereon, at least a first electrode section with a light transmission property, an organic light emission layer section and a second electrode section in that order, the first electrode section containing at least metal nanowires, wherein an average refractive index of the first electrode section is lower than that of the organic light emission layer section;
wherein the first electrode section further contains at least a first transparent resin component and a second transparent resin component having a refractive index higher than that of the first transparent resin component, in which the second transparent resin component and the metal nanowires are contained in a large amount in a first portion of the first electrode section close to the organic light emission layer section and the first transparent resin component is contained in a large amount in a second portion of the first electrode section close to the transparent substrate; and
wherein microparticles are incorporated in a portion where the first transparent resin component is contained.

14. An organic electroluminescent element comprising a transparent substrate and provided thereon, at least a first electrode section with a light transmission property, an organic light emission layer section and a second electrode section in that order, the first electrode section containing at least metal nanowires, wherein an average refractive index of the first electrode section is lower than that of the organic light emission layer section;
wherein the first electrode section further contains at least a first transparent resin component and a transparent inorganic component having a refractive index higher than that of the first transparent resin component, in which the transparent inorganic component and the metal nanowires are contained in a large amount in a first portion of the first electrode section close to the organic light emission layer section and the first transparent resin component is contained in a large amount in a second portion of the first electrode section close to the transparent substrate; and
wherein microparticles are contained in a portion where the first transparent resin component is contained.

15. An organic electroluminescent element comprising a transparent substrate and provided thereon, at least a first electrode section with a light transmission property, an organic light emission layer section and a second electrode section in that order, the first electrode section containing at least metal nanowires, wherein an average refractive index of the first electrode section is lower than that of the organic light emission layer section;
wherein the thickness of the first electrode section is at most 10 µm.

16. An organic electroluminescent element comprising a transparent substrate and provided thereon, at least a first electrode section with a light transmission property, an organic light emission layer section and a second electrode section in that order, the first electrode section containing at least metal nanowires, wherein an average refractive index of the first electrode section is lower than that of the organic light emission layer section;
wherein the first electrode section further contains at least a first transparent resin component and a second transparent resin component having a refractive index higher than that of the first transparent resin component, in which the second transparent resin component and the metal nanowires are contained in a large amount in a first portion of the first electrode section close to the organic light emission layer section and the first transparent resin component is contained in a large amount in a second portion of the first electrode section close to the transparent substrate;
wherein microparticles are incorporated in a portion where the first transparent resin component is contained;
wherein the microparticles are selected from the group consisting of cross-linked acryl resin microparticles, cross-linked styrene resin microparticles, silica microparticles, melamine/formaldehyde resin microparticles, and their composite microparticles.

* * * * *